United States Patent
Hong

(10) Patent No.: US 6,169,002 B1
(45) Date of Patent: Jan. 2, 2001

(54) METHODS OF FORMING TRENCH ISOLATION STRUCTURES BY ETCHING BACK ELECTRICALLY INSULATING LAYERS USING ETCHING MASKS

(75) Inventor: Chang-Ki Hong, Kyunggi-do (KR)

(73) Assignee: Samsung Electronics Co., Ltd. (KR)

( * ) Notice: Under 35 U.S.C. 154(b), the term of this patent shall be extended for 0 days.

(21) Appl. No.: 09/216,192

(22) Filed: Dec. 18, 1998

(30) Foreign Application Priority Data

Dec. 23, 1997 (KR) .................................................. 97-72780

(51) Int. Cl.⁷ .......................... H01L 21/336; H01L 21/76
(52) U.S. Cl. ......................... 438/296; 438/424; 438/435
(58) Field of Search ................................. 438/424, 296, 438/435

(56) References Cited

U.S. PATENT DOCUMENTS

| | | | |
|---|---|---|---|
| 4,636,281 | 1/1987 | Buiguez et al. | 156/643 |
| 5,360,753 | 11/1994 | Park et al. | 437/67 |
| 5,372,950 | 12/1994 | Kim et al. | 437/24 |
| 5,665,635 | 9/1997 | Kwon et al. | 438/427 |
| 5,679,599 | 10/1997 | Mehta | 437/69 |
| 5,712,205 | 1/1998 | Park et al. | 438/425 |
| 5,726,090 | 3/1998 | Jang et al. | 438/435 |
| 5,728,620 | 3/1998 | Park | 438/425 |
| 5,741,740 | 4/1998 | Jang et al. | 438/435 |
| 5,786,262 | 7/1998 | Jang et al. | 438/424 |
| 5,804,491 | 9/1998 | Ahn | 438/425 |
| 5,811,345 | 9/1998 | Yu et al. | 438/424 |
| 5,817,566 | 10/1998 | Jang et al. | 438/424 |
| 5,837,612 | 11/1998 | Ajuria et al. | 438/697 |
| 5,994,201 | * 6/2000 | Lee . | |
| 6,063,694 | * 5/2000 | Togo . | |
| 6,071,792 | * 6/2000 | Kim et al. . | |
| 6,087,243 | * 7/2000 | Wang . | |

\* cited by examiner

*Primary Examiner*—John F. Niebling
*Assistant Examiner*—Josetta Jones
(74) *Attorney, Agent, or Firm*—Myers Bigel Sibley & Sajovec

(57) ABSTRACT

A trench is formed in the integrated circuit substrate via a mask and filled with an electrically insulating layer. The electrically insulating layer is etched back using the mask. After etching the electrically insulating layer the mask is removed. Etching the electrically insulating layer using the mask avoids the protrusion of the electrically insulating layer from the semiconductor substrate associated with the prior art and thereby may reduce the formation of grooves in the electrically insulating layer and improve the reliability of the electrically insulating layer.

12 Claims, 4 Drawing Sheets

METHODS OF FORMING TRENCH ISOLATION STRUCTURES BY ETCHING BACK ELECTRICALLY INSULATING LAYERS USING ETCHING MASKS

FIELD OF THE INVENTION

The present invention relates to the field of integrated circuits in general and more particularly to the fabrication of integrated circuit substrates.

BACKGROUND OF THE INVENTION

Conventional integrated circuits may use a Local Oxidation of Silicon process (LOCOS) to isolate active devices of the integrated circuits. The LOCOS process may, however, create defects in the integrated circuit, such as bird's beaks, as the level of integration of the integrated circuit rises. A technique known as trench isolation may be used to reduce the defects associated with the LOCOS process. Trench isolation techniques may, however, produce other defects in the integrated circuit that can increase device leakage currents, thereby possibly decreasing the reliability of the gate oxide layer of the active device.

FIG. 1A through 1C are enlarged cross-sectional views of structures that illustrate conventional methods of forming integrated circuit substrates containing trench isolation regions. FIG. 1A is an enlarged cross-sectional view of an integrated circuit substrate including a conventional trench isolation layer 18 on a semiconductor substrate 10. In particular, a pad oxide layer 12 and a silicon nitride layer 13 are sequentially formed on the semiconductor substrate 10. The pad oxide layer 12 and the silicon nitride layer 13 are patterned and etched to form a mask 14 that exposes regions of the semiconductor substrate 10 which are to be electrically inactive (which will subsequently be formed into isolation regions). The exposed regions of the semiconductor substrate 10 are selectively etched to form a plurality of trenches 16 in the semiconductor substrate 10, using the mask 14 as an etching mask.

A trench isolation material, such as an oxide layer, is formed in each trench 16 and planarized to form the trench isolation layer 18. The planarization may be performed using Chemical Mechanical Polishing (CMP). During the planarization process the patterned silicon nitride layer, which has an etch selectivity ratio in a range between about 1:3 and 1:4 with respect to the trench isolation layer 18, acts as a polishing stop layer.

Referring to FIG. 1B, the mask 14 is removed using an etchant, which may cause defects to an edge portion 20 of the trench 16 located at the interface of the trench isolation layer 18 and the semiconductor substrate 10. Removing the mask 14 leaves a protrusion of the trench isolation layer 18 from the semiconductor substrate 10. The semiconductor substrate 10 is then cleaned using an isotropic wet chemical process. Unfortunately, like the etchant used to remove the mask 14, the wet chemical process may attack the trench isolation layer 18 at the edge portion 20 of the trench 16 as shown in FIG. 1C.

Referring to FIG. 1D, if the edge portion 20 is etched away by an additional isotropic wet chemical process, grooves may be formed in the trench isolation layer 18, thereby possibly degrading the characteristics of the trench isolation layer 18. Moreover, the grooves may be enlarged by subsequent cleaning steps, possibly further degrading the characteristics of the trench isolation layer 18. Conventional methods of reducing the formation of the grooves described above are discussed in U.S. Pat. No. 5,837,612 to Ajuria et al.; U.S. Pat. No. 5,817,566 to Jang et al.; U.S. Pat. No. 5,811,345 to Yu et al.; U.S. Pat. No. 5,804,491 to Ahn; U.S. Pat. No. 5,786,262 to Jang et al.; U.S. Pat. No. 5,741,740 to Jang et al.; U.S. Pat. No. 5,728,620 to Park; U.S. Pat. No. 5,726,090 to Jang et al.; U.S. Pat. No. 5,712,205 to Park et al.; U.S. Pat. No. 5,679,599 to Mehta; U.S. Pat. No. 5,665,635 to Kwon et al.; U.S. Pat. No. 5,372,950 to Kim et al.; U.S. Pat. No. 5,360,753 to Park et al.; and U.S. Pat. No. 4,636,281 to Buiguez et al. According to Ajuria et al., CMP stops are replaced with polysilicon polish stops which may be more effective in reducing the grooves caused by the wet etching process.

In view of the above, there continues to be a need to improve methods of forming trench isolation structures in integrated circuits.

SUMMARY OF THE INVENTION

It is, therefore, an object of the present invention to allow an improvement in the formation of trench isolation structures in integrated circuits.

It is another object of the present invention to improve the reliability of integrated circuits having trench isolation structures.

These and other objects of the present invention are provided by forming an electrically insulating layer in a trench using a mask and using the mask to etch back the electrically insulating layer. Etching back the electrically insulating layer using the mask may prevent a protrusion of the electrically insulating layer associated with the prior art and reduce the likelihood of grooves forming on the surface of the electrically insulating layer upon the subsequent performance of a wet etching step.

In another aspect of the present invention, the electrically insulating layer is etched back using the mask as a planarization stop and then etching the planarized electrically insulating layer using the mask as an etching mask.

In another aspect of the present invention, the mask comprises a pad oxide layer formed on the semiconductor substrate and a planarization stop layer formed on the pad oxide layer. The planarization stop layer comprises an organic material such as SOG or a polymer layer. The etch rate of the organic material is slow compared to the electrically insulating layer. Consequently, the planarization of the mask and the electrically insulating layer can be controlled because the (organic) planarization stop layer will be etched more slowly than the trench isolation material.

In a further aspect of the present invention, the organic material is made inorganic by exposure to oxygen or by evaporating the organic material. The inorganized material may thereby be etched more easily to complete the trench isolation structure.

DETAILED DESCRIPTION OF PREFERRED EMBODIMENTS OF THE INVENTION

Figure 1A:
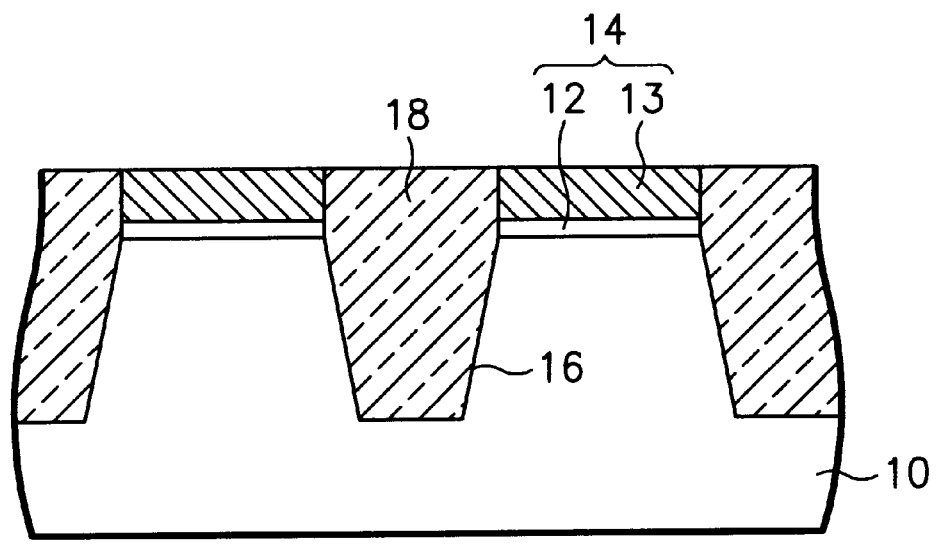
FIGS. 1A to 1D are enlarged cross-sectional views of structures which illustrate conventional methods of forming trench isolation structures in substrates.
Figure 1B:
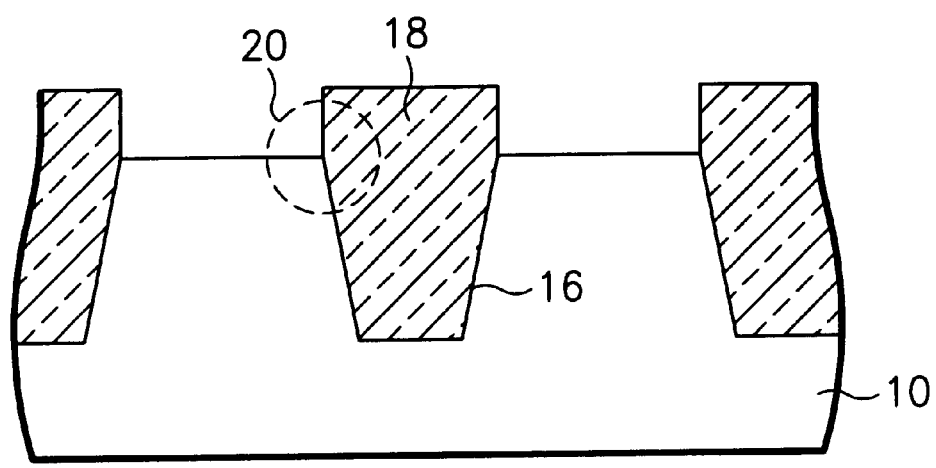
Figure 1C:
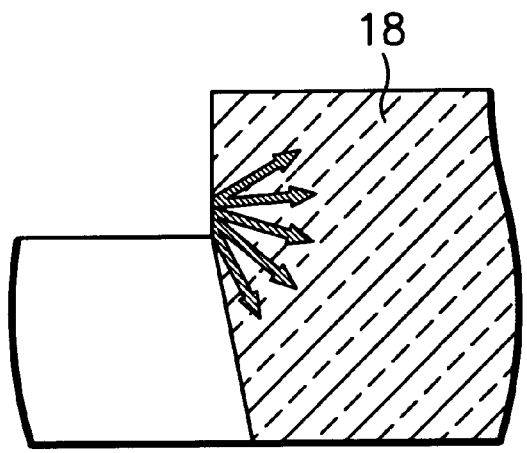
Figure 1D:
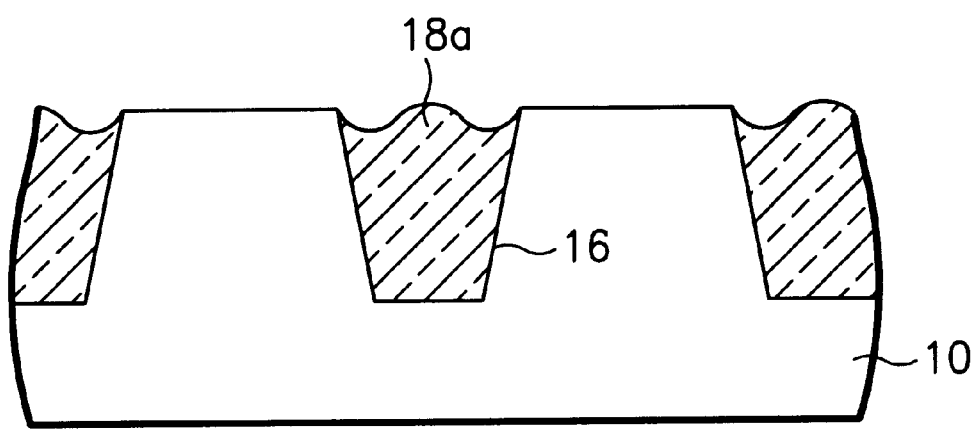

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present.

Figure 2A:
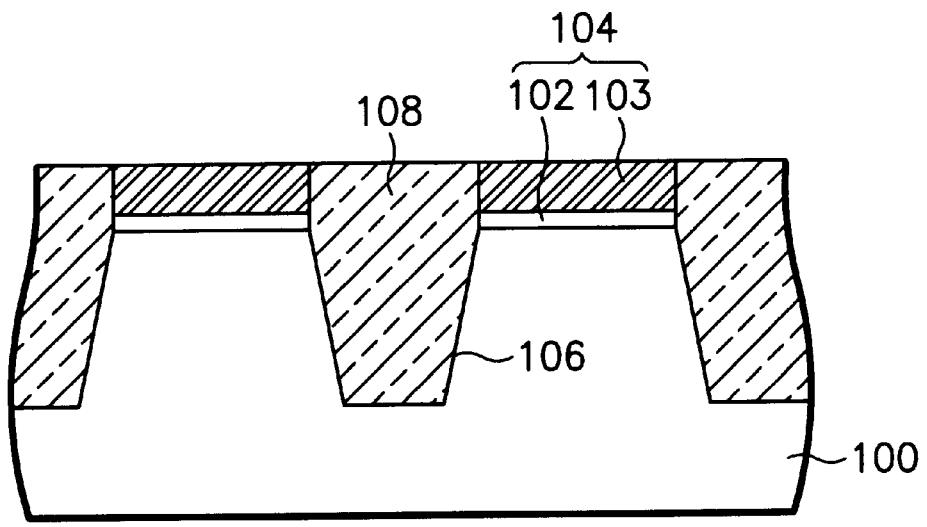
FIGS. 2A to 2D are enlarged cross-sectional views of structures which illustrate methods of forming trench isolation structures in substrates according to the present invention.

FIG. 2A is an enlarged cross-sectional view of an intermediate trench isolation structure according to the present invention. A first pad oxide layer 102 is formed on a semiconductor substrate 100 and an organic material layer 103 is formed on the first pad oxide layer 102. The organic material layer 103 may be comprised of organic Spin On Glass (SOG) or a polymer layer. The first pad oxide layer 102 and the organic material layer 103 are patterned to form a mask 104 on the surface of the semiconductor substrate 100 that extends opposite the surface of the semiconductor substrate 100 and exposes regions of the semiconductor substrate 100. The exposed regions of the semiconductor substrate 100 are etched to form a plurality of trenches 106.

An electrically insulating material is formed in the trench 106 and on the mask 104 to a thickness which will withstand a planarization step. The electrically insulating material may be formed using Atmospheric Chemical Vapor Deposition (APCVD). The electrically insulating material fills the trench 106 and extends onto a portion of the mask 104. The electrically insulating material is then planarized to form a plurality of electrically insulating layers 108. During this planarization step, the mask 104 acts as a planarization stop layer. In particular, the planarization step may be performed using a CMP technique using the organic material layer 103 acts as planarization stop (i.e., a stop for the CMP).

Table 1 illustrates a CMP etching ratio of the APCVD layer (the electrically insulating layer 108) to the SOG layer (the organic material layer 103).

TABLE 1

| Layer | Layer thickness (1) before polishing | layer thickness (2) after polishing | Polishing time | polishing rate | polishing ratio of APCVD to organic SOG |
|---|---|---|---|---|---|
| APCVD | 8061 Å | 3826 Å | two minutes | 2118 Å/min | 5.2:1 |
| organic SOG | 2935 Å | 1991 Å | one minute | 404 Å/min | |

As shown in Table 1, the electrically insulating layer/organic material layer etch rate combination provides an improvement over the APCVD/nitride layer etch rate combination of the prior art. In particular, the ratio of the etch rate of the APCVD layer to the organic SOG layer is 5.2:1 compared to the selectivity range of 3:1–4:1, as described with respect to the methods of FIGS. 1A–1D.

Figure 2B:
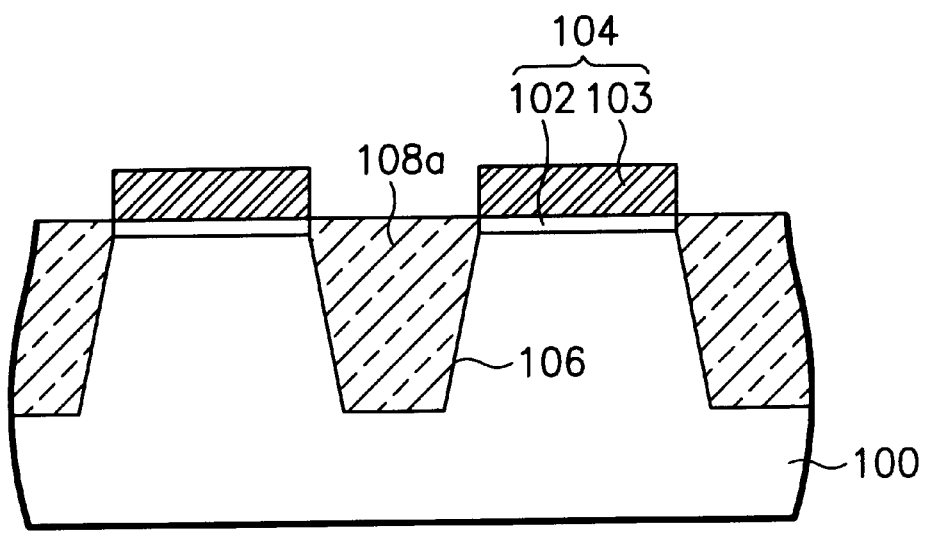

FIG. 2B is an enlarged cross-sectional view of the mask 104 on the semiconductor substrate 100 and electrically insulating layer 108a. The electrically insulating layer 108a is formed by etching back the electrically insulating layer 108 using the mask 104 as an etching mask. In particular, the electrically insulating layer 108 is etched back to a level which is coplanar with the interface of the first pad oxide layer 102 and organic material layer 103. The etching back step may be performed using a wet etchant such as 200:1 Hydrofluoric acid (HF).

Table 2 illustrates a wet etching ratio of the APCVD layer to the organic SOG layer.

TABLE 2

| Layer | etching amount in 200:1 HF | etching time | etching rate | etching ratio of APCVD to organic SOG |
|---|---|---|---|---|
| APCVD | 183 Å | one minute | 183 Å/min | 26:1 |
| organic SOG | 7 Å | one minute | 7 Å/min | |

Figure 2C:
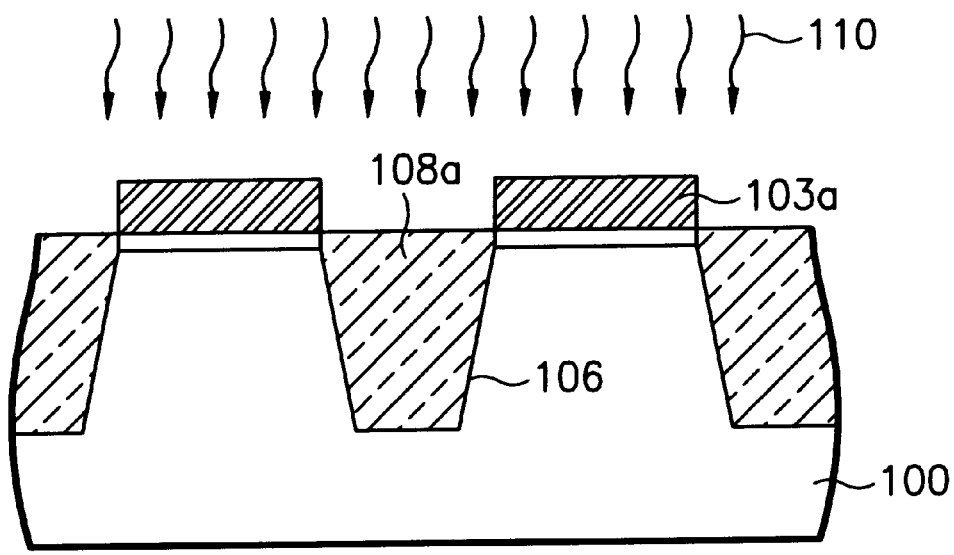

FIG. 2C is an enlarged cross-sectional view of the organic material layer 103 having been transformed into an inorganized material layer 103a. According to FIG. 2C, the organic material layer 103 is exposed to a composition 110 to thereby produce the inorganized (having a reduced organic content) material 103a. For example, the organic material layer 103 may be exposed to oxygen in a sufficient amount to cause a reaction with the organic component of the organic material 103. The oxygen may be provided via plasma treatment, oxygen ion implantation, or by ozone (O3) treatment. Alternately, the organic component of the organic material layer 103 may be evaporated to produce the inorganized material 103a.

Table 3 illustrates a wet etching ratio of the inorganized SOG layer to the APCVD layer after $O_3$ treatment.

TABLE 3

| Layer | etching amount in 200:1 HF | etching time | Etching rate | etching ratio of organic SOG to APCVD |
|---|---|---|---|---|
| organic SOG (after $O_3$ asher) | at least 2130 Å | one minute | at least 2130 Å/min | at least 23:1 |
| APCVD (after $O_3$ asher) | 91 Å | one minute | 91 Å/min | |

Figure 2D:
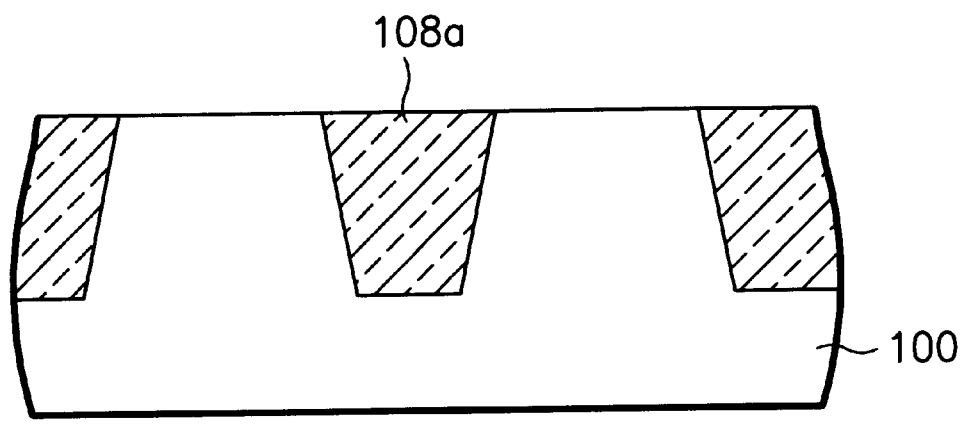

The inorganized material 103a, the first pad oxide layer 102, and a top portion of the electrically insulating layer 108a are then etched away using, for example, 200:1 HF. The trench isolation structure of FIG. 2D is thereby formed without the grooves associated with the prior art.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit substrate comprising the steps of:

forming a mask on a surface of a semiconductor substrate;

etching the semiconductor substrate to form a trench therein, using the mask as a an etching mask;

filling the trench with an electrically insulating layer;

etching back the electrically insulating layer using the mask as an etching mask; and then removing the mask to expose the surface of the semiconductor substrate.

2. The method of claim 1, wherein the step of filling the trench comprises the step of filling the trench with an electrically insulating layer which extends onto a portion of the mask which extends opposite the surface; and wherein said step of etching back the electrically insulating layer comprises the steps of planarizing the electrically insulating layer using the mask as a planarization stop and then etching the planarized electrically insulating layer using the mask as an etching mask.

3. The method of claim 1, wherein the step of forming the mask comprises the steps of:

forming an oxide layer on the integrated circuit substrate; and then forming a planarization stop layer comprising an organic material on the oxide layer.

4. The method of claim 3, wherein the step of forming the planarization stop layer comprises forming the planarization stop layer comprising an organic material selected from the group consisting of organic spin on glass and a polymer layer.

5. The method of claim 3, wherein the step of forming the electrically insulating layer comprises the step of planarizing the electrically insulating layer and the mask until the planarization stop layer is exposed.

6. The method of claim 3, wherein the step of removing the mask comprises the steps of:

removing the organic material from the planarization stop layer to provide an inorganic planarization stop layer; and etching the mask and the electrically insulating layer until the inorganic planarization stop layer is removed.

7. The method of claim 6, wherein the step of removing comprises the step of exposing the mask to oxygen.

8. The method of claim 7, wherein the step of exposing comprises the step of exposing the mask to oxygen via a plasma treatment, an oxygen ion implantation, or an ozone treatment.

9. The method of claim 6, wherein the step of removing comprises the step of evaporating the organic material from the planarization stop layer.

10. The method of claim 2, wherein the step of etching back comprises the step of etching back the electrically insulating layer until the planarization stop layer is exposed, using a wet etch process.

11. The method of claim 1, wherein the step of removing comprises the step of etching the mask and the electrically insulating layer using a wet etchant, wherein the etch ratio of the mask and the electrically insulating layer is at least 20:1 for the wet etchant.

12. The method of claim 5, wherein the step of planarization comprises the step of planarizing the electrically insulating layer and the mask until the planarization stop layer is exposed using chemical mechanical polishing.

* * * * *